(12) United States Patent
Cantwell

(10) Patent No.: US 11,275,975 B2
(45) Date of Patent: Mar. 15, 2022

(54) FAULT DETECTION CLASSIFICATION

(71) Applicant: Applied Materials, Inc., Santa Clara, CA (US)

(72) Inventor: Dermot Cantwell, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 614 days.

(21) Appl. No.: 15/726,145

(22) Filed: Oct. 5, 2017

(65) Prior Publication Data

US 2019/0108422 A1 Apr. 11, 2019

(51) Int. Cl.
| | | |
|---|---|---|
| *G06K 9/62* | (2006.01) | |
| *G05B 23/02* | (2006.01) | |
| *G05B 19/418* | (2006.01) | |
| *G01R 31/28* | (2006.01) | |
| *H01L 21/66* | (2006.01) | |

(52) U.S. Cl.
CPC ....... *G06K 9/6284* (2013.01); *G01R 31/2894* (2013.01); *G05B 19/41875* (2013.01); *G05B 23/0221* (2013.01); *G05B 23/0281* (2013.01); *H01L 22/20* (2013.01)

(58) Field of Classification Search
CPC .......... G05B 19/4184; G05B 19/41875; G05B 23/0221; G05B 2219/32179; G05B 2219/45031; G05B 23/0281; G01R 31/2894; G06K 9/00536; G06K 9/6273; G06K 9/6284; H01L 22/20
See application file for complete search history.

(56) References Cited

U.S. PATENT DOCUMENTS

| | | | |
|---|---|---|---|
| 9,852,371 B2 | 12/2017 | Cantwell | |
| 2004/0110311 A1* | 6/2004 | Flanner | H01L 21/67276 438/10 |
| 2004/0143357 A1* | 7/2004 | Schwarm | G05B 15/02 700/121 |
| 2007/0265743 A1* | 11/2007 | Kojitani | G06K 9/6268 701/32.9 |
| 2015/0269050 A1 | 9/2015 | Filimonov et al. | |

(Continued)

FOREIGN PATENT DOCUMENTS

| | | |
|---|---|---|
| JP | 2008-130925 A | 6/2008 |
| JP | 2012141712 A | 7/2012 |

(Continued)

OTHER PUBLICATIONS

International Search Report and Written Opinion for PCT/US2018/052255 dated Jan. 17, 2019.

(Continued)

*Primary Examiner* — Yoshihisa Ishizuka
(74) *Attorney, Agent, or Firm* — Patterson + Sheridan, LLP

(57) ABSTRACT

Embodiments disclosed herein generally relate to a method, system, and non-transitory computer readable medium for classifying an outlier in time series data collected by a sensor positioned in a substrate processing chamber. The client device receives time series data from the sensor positioned in the substrate processing chamber. The client device converts the time series data to a bounded uniform signal. The client device identifies signal sub-segments that do not match an expected behavior. The client device classifies the identified sub-segments that do not match the expected behavior.

20 Claims, 12 Drawing Sheets

(56) References Cited

U.S. PATENT DOCUMENTS

2015/0318221 A1 11/2015 Kim et al.
2015/0347568 A1 12/2015 Chen et al.
2016/0026915 A1* 1/2016 Delp ................. G05B 23/0229
 706/20
2017/0030807 A1 2/2017 Chou et al.

FOREIGN PATENT DOCUMENTS

| KR | 101625320 B1 | 5/2016 |
| KR | 10-2016-0147009 A | 12/2016 |
| WO | 2014113403 A1 | 7/2014 |
| WO | 2016009626 A1 | 1/2016 |

OTHER PUBLICATIONS

Korean Office Action, Application No. 10-2020-7012289, dated Nov. 29, 2021.
Office Action for Japanese Patent Application No. 202-518409 dated Jan. 18, 2022.

* cited by examiner

FAULT DETECTION CLASSIFICATION

BACKGROUND

Field

Embodiments of the present disclosure generally relate to semiconductor manufacturing, and, more specifically, embodiments of the present disclosure relate to outlier detection in sensor data retrieved during semiconductor processing.

Description of the Related Art

Manufacturing of electronic devices typically involves performing a sequence of procedures with respect to a substrate such as a silicon substrate, a glass plate, etc. (Such substrates may also be referred to as wafers, whether patterned or unpatterned.) These steps may include polishing, deposition, etching, photolithography, heat treatment, and so forth. Usually a number of different processing steps may be performed in a single processing system or "tool" which includes a plurality of processing chambers. During processing, each chamber in which a procedure is carried out may include a plurality of sensors, with each sensor configured to monitor a predefined metric relating to substrate processing.

Outlier detection in sensor trace data aids in assessing the overall health of the chamber in which a substrate processing procedure is carried forth. As the demands for semiconductor manufacturing increase, such methods for detecting Outlier detection need to increasingly become more sensitive to detect anomalies in a more refined range of sensor data, as well as scalable, to be able to compute Outlier detection algorithms when batches of substrates increase to the thousands.

Therefore, there is a continual need for an improved method of detecting outliers in sensor data retrieved during semiconductor processing.

SUMMARY

Embodiments disclosed herein generally relate to a method, system, and non-transitory computer readable medium for classifying an outlier in time series data collected by a sensor positioned in a substrate processing chamber. The client device receives time series data from the sensor positioned in the substrate processing chamber. The client device converts the time series data to a bounded uniform signal. The client device identifies signal sub-segments that do not match an expected behavior. The client device classifies the identified sub-segments that do not match the expected behavior.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
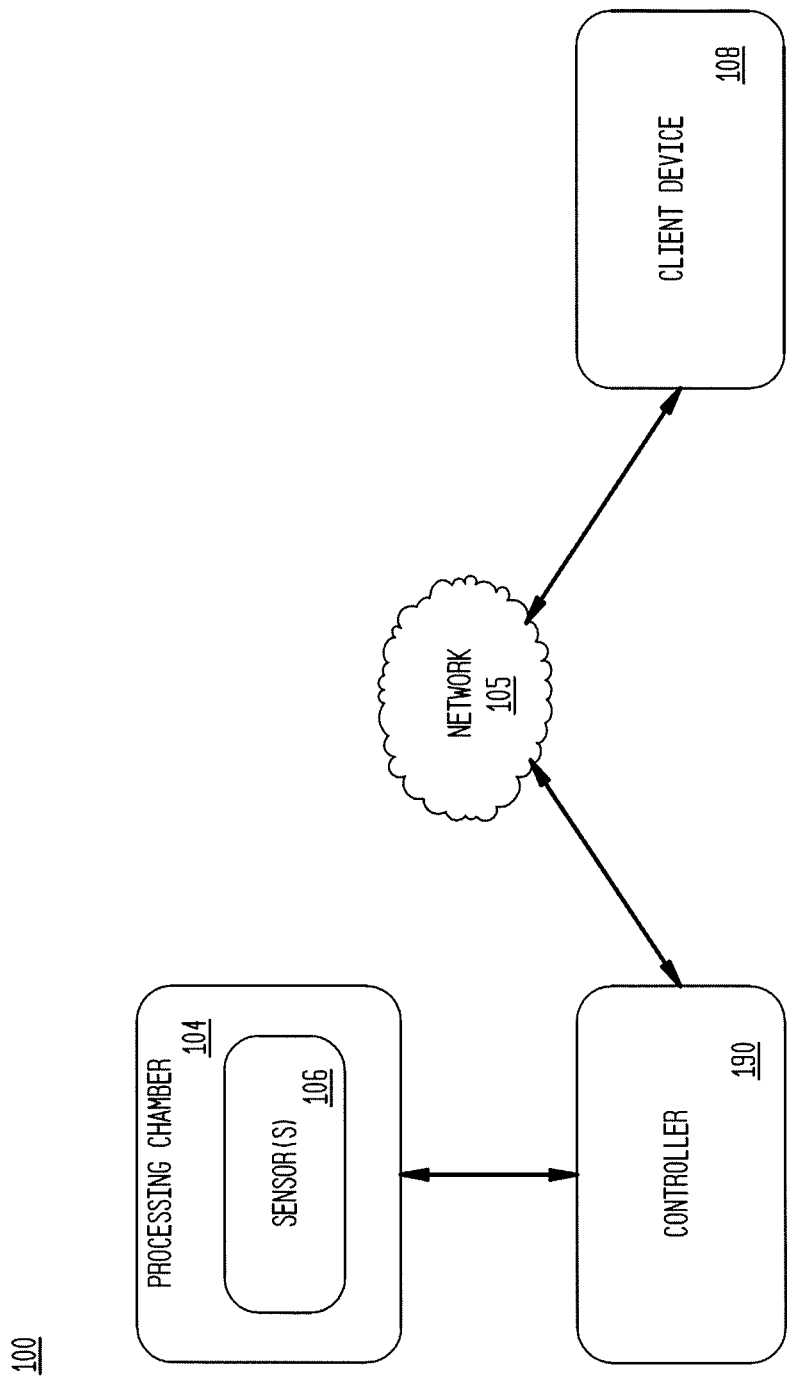
FIG. 1 illustrates a computing environment, according to one embodiment disclosed herein.

FIG. 1 illustrates a computing environment 100, according to one embodiment. The computing environment 100 includes a controller 102 and client device 108. The controller 102 communicates with client device 108 over network 105. The controller 102 may be a controller in use with one or more substrate processing chambers 104. For example, the controller 102 may be a controller that aids in controlling the process parameters of each substrate processing chamber 104. Each processing chamber 104 has one or more sensors 106 positioned therein. Each sensor 106 is configured to monitor a metric associated with a semiconductor processing process. Each senor 106 provides the measurement of each metric to the controller 102 for further processing.

Client device 108 communicates with the controller 102 over network 105. For example, controller 102 may transmit the sensor data collected from each sensor 106 to the client device 108 for further analysis. In some embodiments, client device 108 is configured to detect novelties or abnormal behavior in time series data sets generated by the controller 102 for sensor 106 measurements. In additional embodiments, client device 108 may further be configured to classify the detected abnormalities, if known, and label or learn the fault signature associated with the detected abnormalities. As such, client device 108 may learn as it experiences new faults or novelties in the time series data.

Figure 2:
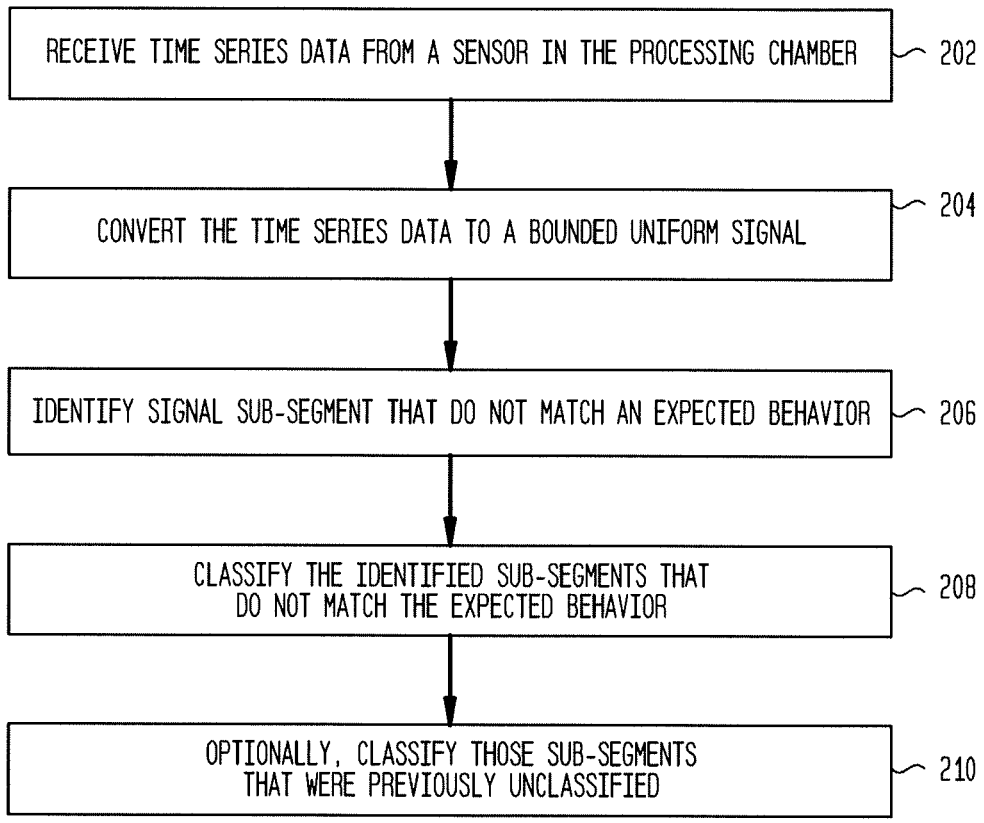
FIG. 2 is a flow diagram illustrating a method of classifying outliers, according to one embodiment disclosed herein.

FIG. 2 is a flow diagram illustrating a method 200 of classifying outliers, according to one embodiment. The method 200 begins at block 202. At block 202, the client device 108 receives substrate processing data from the controller in communication with a substrate processing chamber. For example, a sensor positioned in a processing chamber may monitor a metric related to the processing of a substrate. In another example, the sensor may be positioned exterior to the processing chamber. The controller transmits the data associated with the substrate process metric to the client device 108 for further analysis.

Figure 3:
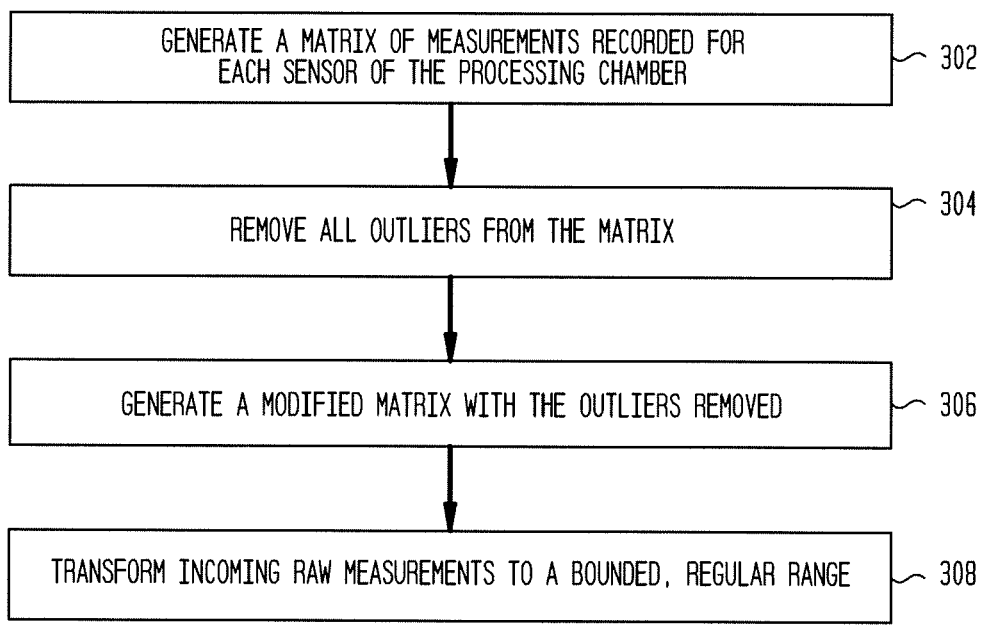
FIG. 3 is a flow diagram illustrating a block from the method of FIG. 2, discussed in more detail, according to one embodiment disclosed herein.

At block 204, the client device 108 converts the time series data received from the controller to a bounded uniform signal. FIG. 3 illustrates block 204 in more detail. For example, FIG. 3 illustrates a method of filtering the incoming time series data to remove any false positives in the time series data. To convert the incoming time series data, the client device 108 generates a matrix, T, of measurements recorded for each sensor of the substrate processing system (block 302). For example, assuming there are K sensors of the substrate processing chamber, client device 108 generates K matrices, $T_1$ to $T_K$. For purposes of the discussion below, assume the processing chamber includes a single sensor, thus resulting in a single matrix, T.

The matrix T includes measurements associated with m runs in the substrate processing chamber. A "run" refers to a single substrate being processed. For each run, there are n times during which measurements are recorded by the sensor. Accordingly, the matrix, T, is an m×n matrix. For example, the matrix, T, may be represented as:

$$T = \begin{pmatrix} t_{1,1} & \cdots & t_{1,n} \\ \vdots & \ddots & \vdots \\ t_{m,1} & \cdots & t_{m,n} \end{pmatrix}$$

where, $t_{i,j}$, represents a given measurement during run i and time j. Thus, each column represents all run data at a given time slice, n.

To convert the time series data received from the controller to a bounded uniform signal, client device 108 removes any outliers from the data set (i.e., matrix T) to generate a modified matrix, T' (block 304). To remove the outliers from the data set, for each column 1 ... n, the client device 108 applies Grubbs' rule to the measurements in the column. Grubbs' rule is a statistical test used to detect outliers in a univariate data set. Grubbs' rule detects one outlier at a time. The outlier is expunged from the data set and the test is iterated until no outliers are detected. Grubbs' rule is defined for the hypothesis:

$H_0$: There are no outliers in the data set.
$H_a$: There is exactly one outlier in the data set.

The Grubbs' test statistic, G, is defined as:

$$G = \frac{\max|Y_i - \overline{Y}|}{s}$$

where $Y_i$ is X, $\overline{Y}$ bar is the sample mean, and s is the standard deviation.

The hypothesis is rejected responsive to $$G > \frac{N-1}{\sqrt{N}} \sqrt{\frac{\left(t_{\frac{\alpha}{2N},N-2}\right)^2}{N-2+\left(t_{\frac{\alpha}{2N},N-2}\right)^2}}$$

where N represents the number of rows and $$t_{\frac{\alpha}{2N},N-2}$$

denotes the crucial value of the t distribution with (N−2) degrees of freedom and a significance level of α/(2N).

Applying Grubbs' rule to matrix, T, Grubbs' rule is applied on the n time slices of a given run, m, of measurement data. If an outlier is detected, it is removed and Grubbs' rule is re-run on the remaining (m−1) runs for time slice, n. The process is repeated until no outliers are detected. Accordingly, each column in the matrix T may include data for a varying amount of runs (m). For example, column 1 may include (m) entries, column 2 may include (m−1) entries; column 3 may include (m−5) entries, and the like. It should be noted that there are a max number of m samples in a time-slice n, so applying Grubbs may remove 1 or more runs m from the a timeslice n.

After client device 108 removes all outliers from matrix, T, client device generates matrix, T' (block 306). Matrix, T', is a 3×n matrix, where the rows define the minimum, maximum, and mean at each time slice, provided by the columns in matrix T. For example, matrix, T', may be represented mathematically as:

$$T' = \begin{pmatrix} t_{max,1} & \cdots & t_{max,n} \\ t_{min,1} & \ddots & t_{min,n} \\ t_{mean,1} & \cdots & t_{mean,n} \end{pmatrix}$$

where each column represents a given time, t, from t=1 ... n, and each row represents, maximum, minimum, and mean measurement for each time, t. Accordingly, matrix, T', defines the "envelope" or the expected upper and lower limits of the input signal, as well as the mean (or normal) of the signal. For example, the envelope may be bounded from +1 (max) to −1 (min) with a mean (or normal) of 0.

Using the matrix, T', the client device 108 can subsequently transform incoming raw signals from the controller into a bounded, regular range (block 308). Generally, for any sample, $t_n$, where n defines the column in matrix, T', row 0 corresponds to the mean at time slice n, row 1 corresponds to the maximum at time slice n, and row 2 corresponds to the minimum at time slice n.

Using the modified matrix, T', client device 108 can convert a sample at $t_n$ using:

$$\bar{t}_n = 2\left(\frac{t_n - T'_{0,n}}{r_n}\right)$$

where $r_n = (T_{1,n}' - T_{2,n}')$. The term $r_n$ defines the expected range of values at time n. In some cases, $r_n$ can become small (i.e., approach zero), which may lead to an "envelope collapse." To address this issue, two additional input terms may be added to the transform. The term $r_{min}$ is used to define the allowable minimum range of values. The term $p_{min}$ is used to define the allowable minimum range of values expressed as a percentage of an expected value. Thus, to avoid the situations in which $r_n$ approaches zero, if $r_n <$ max $(r_{min}, p_{min})$, then client device 108 replaces $r_n$ with max$(r_{min}, p_{min})$. The conversion equation then looks like the following:

$$\bar{t}_n = 2\left(\frac{t_n - T'_{0,n}}{\max(r_{min}, p_{min})}\right)$$

Therefore, for any set of input traces received from the controller, the client device may transform the input traces to a signal that is bounded by an upper and lower limit.

Referring back to FIG. 2, after the client device 108 converts the time series data received from the controller to a bounded uniform signal, client device 108 identifies sub-segments of the signal that do not match an expected behavior (block 206). For example, client device 108 leverages the data transform in block 204 to approximate a k-nearest neighbor (k-NN) computation by the normal of the input time signal. As discussed above, client device 108 generates an "envelope" for the received signal, i.e., the expected upper and lower limits of the input signal, as well as the mean (or normal) of the signal, filters outliers in each time-slice via Grubbs rule and then transforms to a fixed bounded signal. In one example we may have about 200 runs with each having about 45 samples such that the matrix T has 200 rows, 45 columns. Grubbs rule executed on each column will remove the outliers. After Grubbs is finished, the T' matrix is left with the same number of columns as original matrix T, but only 3 rows for each for min, max and mean. Grubbs helps create an outlier free expected signal. In a specific example, the upper limit is +1, the lower limit is −1, and the mean normal is 0.

Figure 4:
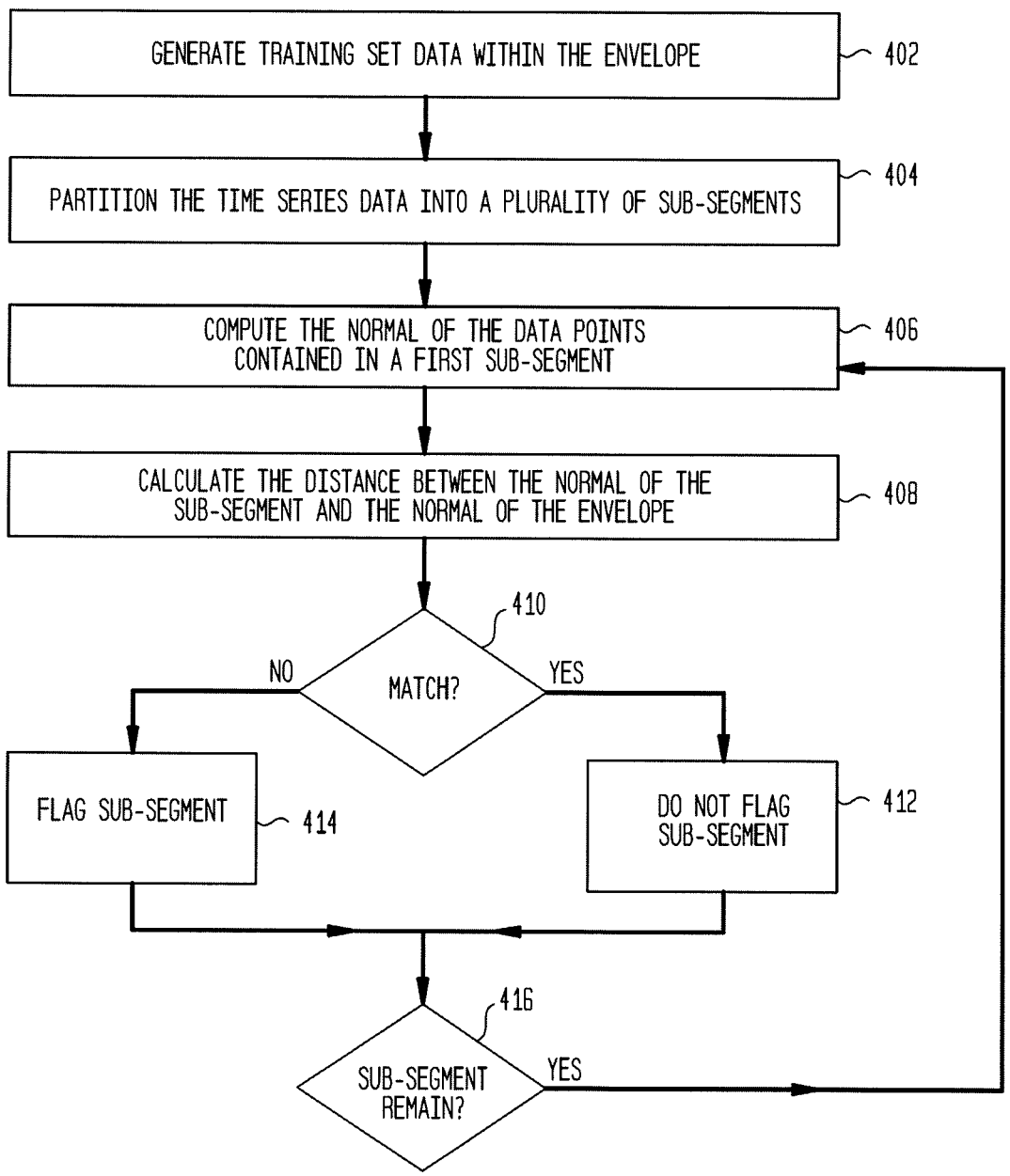
FIG. 4 is a flow diagram illustrating a block from the method of FIG. 2, discussed in more detail, according to one embodiment disclosed herein.
Figure 5:
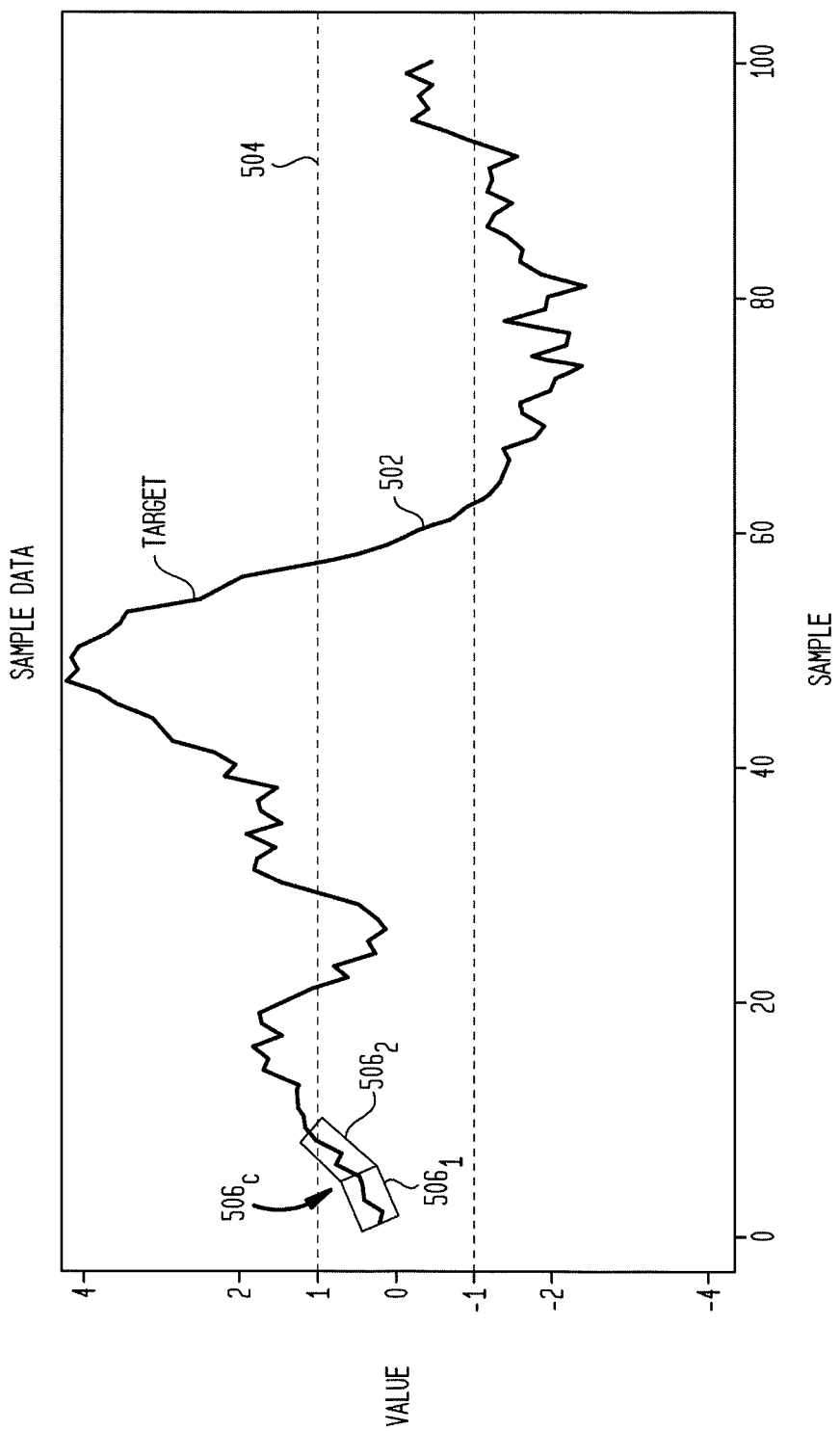
FIG. 5 illustrates a graph depicting an example time data series signal, according to one embodiment disclosed herein.

FIG. 4 is a flow diagram illustrating block 206 in further detail. To identify sub-segments that do not match an expected behavior, client device 108 first generates training set data within the envelope defined above (block 402). For example, FIG. 5 illustrates a graph 500 depicting an example time data series signal 502, according to one embodiment. Graph 500 includes the envelope 504 determined in block 202 above. For example, the envelope 504 is an area bounded by a maximum amount of +1 and a minimum amount of −1. The envelope 504 has a mean value of 0. Assuming that any signal has an equal probability of residing anywhere within the (−1,+1) range of the envelope 504, client device 108 generates the artificial training data, where any sample, $x_i$, may be located within the envelope 504, such that it is uniformly distributed with each additional sample, $x_i$. Mathematically, this may be represented as:

$$\{x_i\}, x_i = |\text{unif}(-1,1)|$$

The artificial training data, i.e. $\{x_i\}$, defines the expected behavior of an incoming time series data signal. We now have transformed a signal into a bounded [−1,+1] signal using the process described above. The next step is to fit the artificial training data to a logit function. The logit function is an inverse of the sigmoidal logistic function. The logit function fits the artificial data set, for any time-window size, and allows the algorithm to generate a probability of a sub-segment of the time series data signal to match expected behavior.

Figure 6:
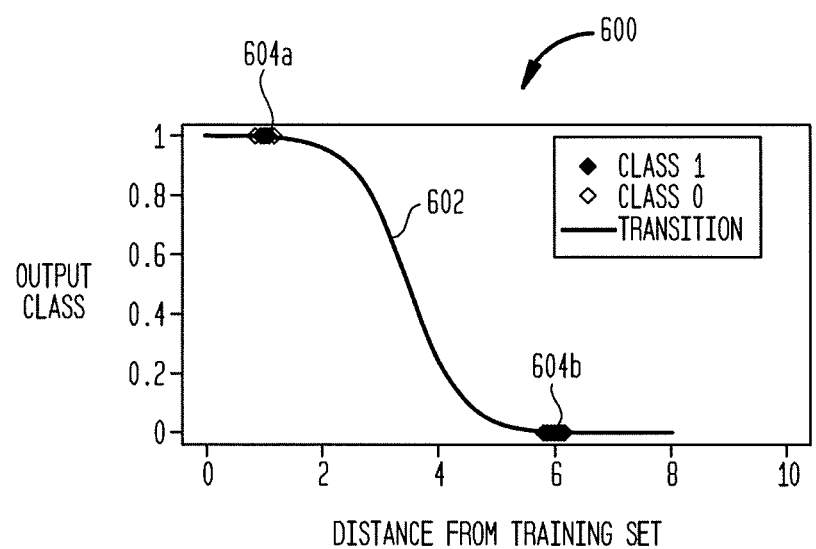
FIG. 6 is a graph illustrating the logit curve, according to one embodiment disclosed herein.

FIG. 6 illustrates a graph 600 illustrating the logit curve 602. Points 604a correspond to the artificial data generated in 108. In addition, points 604b are also generated at the same time, which are points 604a 'mirrored' through a reflection point. The reflection point sets the 'sensitivity' of the system. A higher sensitivity point means the algorithm is less sensitive. If we have a big reflection point then the difference between 604a and 604b is large and it would take a big excursion to get the probability moving from 1 to 0. In FIG. 6, the reflection point is at 4 (on the x-axis). The logit is then fit to the point dataset (604a & 604b). The logit is defined below, where X is the point data set 604a and 604b.

$$p(y \mid X) = \frac{1}{1 + e^{\frac{-\beta X}{\theta}}}.$$

and β represents a learned or a computed parameter. p(y|X) is the probability, between 0 and 1, that the signal in the sub-segments matches the expected behavior, as defined by the envelope 504.

The training (X) data is used to estimate β. When we create the artificial data, we create 2 sets, values for when a sub-segment of the data matches the expected behavior of point data set 604a and values for when the sub-segment does not match the expected behavior of point data set 604b. Client device 108 creates the two data sets, so depending on how they are generated, the algorithm sensitivity can be modified. Parameter θ controls the transition from 1 to 0, and is another sensitivity parameter. A high value means we see p(y|X) slowly reducing from 1 (sub-segment is in the envelope) to 0 (sub-segment is outside the envelope). Using this we can see failures as the start. A low value means we get an abrupt (step change). p(y|X) is the probability, between 0 and 1, that the signal in the sub-segment matches the expected behavior, as defined by the envelope 504.

At block 404, the client device 108 partitions the time data series signal 502 into a plurality of sub-segments $506_i$. Each sub-segment $506i$ may include a plurality of data points contained therein. Generally, each sub-segment may span from a time t=a to a time t=b. In one embodiment, the first sub-segment $506_1$ may span from time t=0 to time t=24, i.e., the first sub-segment $506_1$ spans 25 seconds. In the same embodiment, a second sub-segment $506_2$ may span from time t=25 to t=50. In some instances, a sub-segment $506_i$ may be a sliding window that stretches backwards from the present. For instance, a sub-segment of two seconds may include any samples or data points that have occurred in the past two seconds.

At block 406, the client device 108 computes the normal of the data points contained in the sub-segment. For example, referring to FIG. 5, client device 108 determines those data points contained in the window for t=0 to t=24 for sub-segment $506_1$. Within sub-segment $506_1$ are a plurality of readings corresponding to a given semiconductor processing sensor. The client device 108 then computes the average (i.e., the normal) of the measurements in the sub-segments. This may be computed easily as the data points contained in the sub-segment $506_1$ may be thought of as a vector.

At block 408, the client device 108 computes distance between the normal of the sub-segment $506_1$ and the normal of the envelope 504. For example, as shown in FIG. 5, client device 108 computes the shortest distance between the normal of the sub-segment $506_1$ and the normal of the envelope 504. The client device 108 may apply the result to the logit function.

Accordingly, the client device 108 can easily determine whether the signal in the sub-segment $506_1$ matches the expected behavior. At block 410, the client device 108 determines whether the sub-segment $506_1$ matches the expected behavior. For example, the client device 108 determines whether the sub-segment $506_1$ matches the expected behavior from the logit fit discussed above in conjunction with block 408. If the client device 108 determines that the sub-segment $506_1$ matches the expected behavior, then at block 412, the client device 108 does not flag the sub-segment $506_1$. If, however, the client device 108 determines that the sub-segment $506_1$ does not match the expected behavior, then at block 414, the client device 108 flags the sub-segment $506_1$ for further analysis.

At block 416, the client device 108 determines whether there are any sub-segments $506_1$ remaining to be analyzed. If there are sub-segments $506_1$ remaining, then the method 400 reverts to block 406. If, however, there are not any sub-segments $506_1$ remaining, then the method 400 ends.

Referring back to FIG. 2, at block 208, the client device 108 classifies those identified sub-segments that do not match an expected behavior. For example, an artificial neural network may be used to classify such sub-segments. Artificial neural networks may be useful in analyzing an operation in a system based on known values of the system. For example, a user may be interested in analyzing sensor data, such as the time series data collected from sensors in the semiconductor processing chamber. A Radial Basis Function (RBF) network is an artificial network that uses radial basis functions as activation functions. In a typical RBF network, an RBF node (or "neuron") is responsible for determining the activation value of the node, where each node has multiple inputs and a single output.

An RBF function can be defined as any function whose value depends only on the distance from the origin. Mathematically, this may be represented as:

$$\varphi(x)=\varphi(\|x\|)$$

Figure 7:
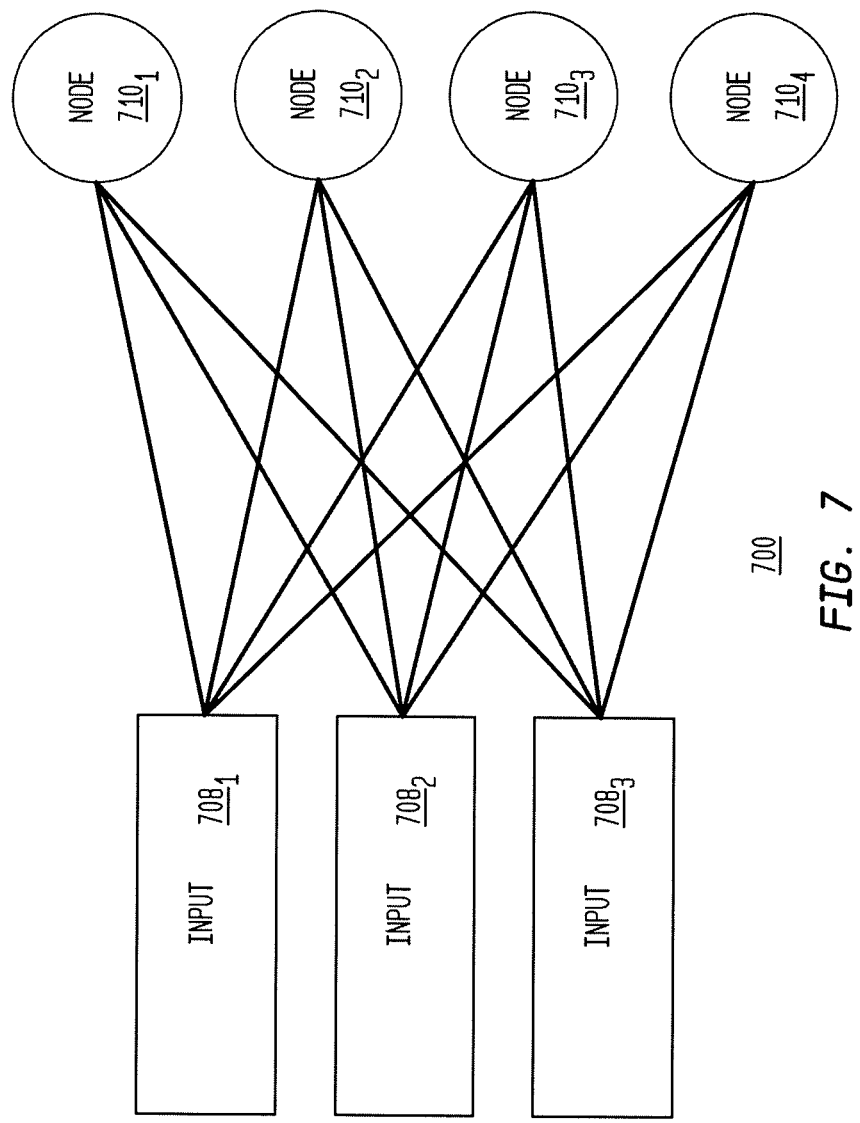
FIG. 7 is a diagram illustrating an RBF network, according to one embodiment disclosed herein.

An RBF network is a collection of RBF functions located in an n-dimensional space. For example, FIG. 7 is a diagram 700 illustrating an RBF network 702, according to one embodiment. RBF network 702 includes two layers, an input layer 704 and a RBF layer 706. As illustrated, the network 702 includes three (3) inputs ($708_1$-$708_3$) and four (4) RBF nodes ($710_1$-$710_4$). Here, each node can be defined using an n-element vector, and the input to each node may also be an n-element vector. The network shown in FIG. 7 is capable of distinguishing 5 unique types of unexpected behavior. Each node $710_i$ represents a unique type of unexpected behavior. Incoming sub-segments may be categorized to one of nodes $710_1$-$710_4$ or no node at all.

Generally, for each node $710_i$, a hyper-cube is determined for the node. The client device then determines whether a sub-segment resides within the hyper-cube. If the sample does not reside within the hyper-cube, then the system determines whether the sample resides in a hyper-sphere that has a radius equal to a diagonal of the hyper-cube. The system, then determines a likely sample class, e.g., normal or abnormal, based on whether the sub-segment resides within the hyper-cube (normal), hyper-sphere (normal with lower confidence) or neither (abnormal).

In one embodiment, the maximum error for any given node is along a single axis and can be computed for evaluation regardless of whether the network and error are tolerable. In one embodiment, the error can be minimized by adding additional nodes on the axes with relevant labels.

Figure 8:
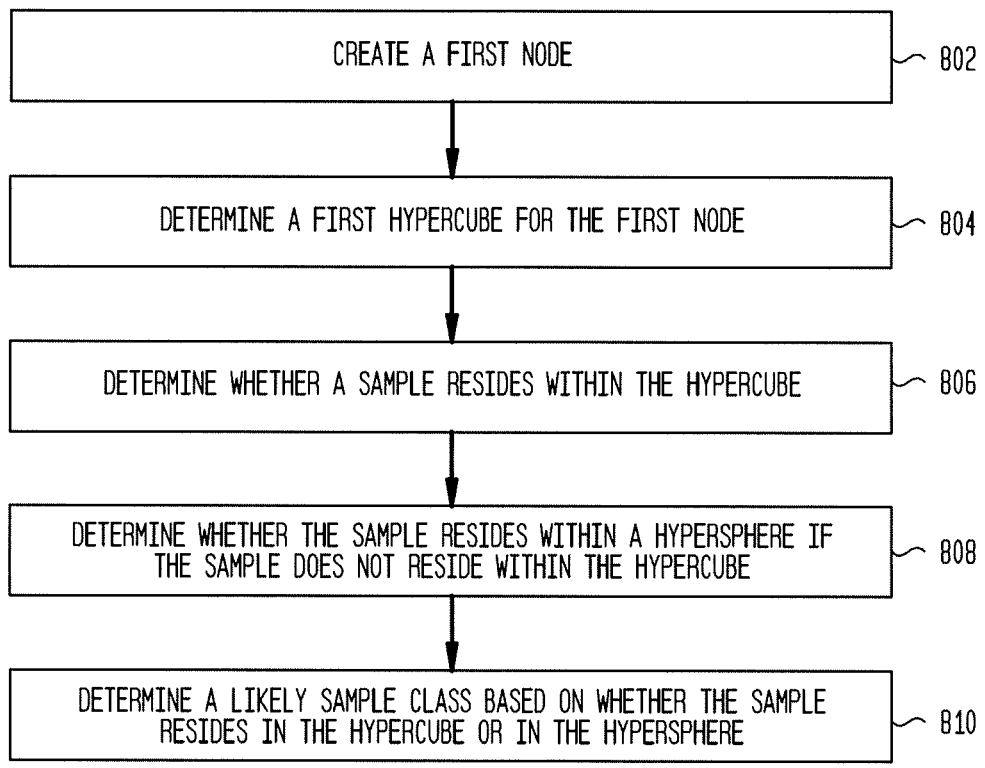
FIG. 8 is a flow diagram of a method for RBF network and hyper-cube analysis, according to one embodiment disclosed herein.

FIG. 8 is a flow diagram of a method 800 for RBF network and hyper-cube analysis. Method 800 can be performed by processing logic that can comprise hardware (e.g., circuitry, dedicated logic, programmable logic, microcode, etc.), software (e.g., instructions run on a process device), or a combination thereof. In one embodiment, method 800 may be run on system 1400 of FIG. 14 discussed below.

Figure 9:
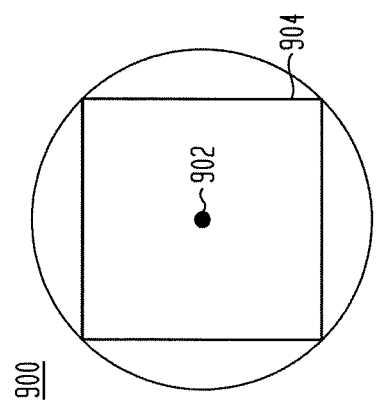
FIG. 9 is a logical diagram illustrating a first node used for the RBF method of FIG. 8, according to one embodiment disclosed herein.

At block 802 of FIG. 8, client device 108 creates a first node 902, as shown in diagram 900 illustrated in FIG. 9. The first node 902 includes multiple inputs and one output. For example, the multiple inputs may include one or more data points from an identified sub-segment. To create a node, a number of inputs n, a location L[n], where L[n] vector determines the node location in n-dimensional space, and a receptive field r (the dimension or size of the node) are provided. In an embodiment, a default r value is 1.

At block 804, client device 108 determines a first hyper-cube 904 for the first node 902. In one embodiment, a 3-sigma hyper-cube is created based on reference data. In other words, the size of the first hyper-cube is 3 sigma.

At block 806, client device 108 determines whether a sub-segment resides within the first hypercube 904. For example, client device 108 determines whether a sub-segment resides within the first hypercube 904, when mirrored about the origin of the first node. Mathematically, the following equation may be computed:

$$c[x]=\|i[x]-l[x]\|, \text{ for } x=1 \text{ to } n$$

Figure 10:
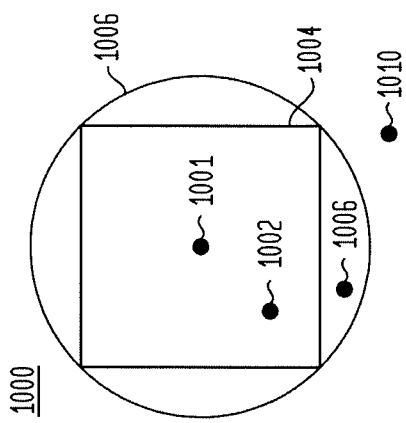
FIG. 10 is a diagram illustrating a first node, according to one embodiment disclosed herein.

When a hyper-cube is used for detection, the output for any node will be either 0 or 1, where 1 indicates residence in the hyper-cube. If the c[x] value is less than or equal to r (i.e., the receptive field) for the first node, the first node output is 1. In this case, the client device has used the first hyper-cube to detect what class the sub-segment belongs to and the RBF functions are not activated. For example, FIG. 10 is a diagram 1000 illustrating a first node 1001, according to one embodiment. If a sub-segment 1002 falls within a first hyper-cube 1004, then the sub-segment 1002 is deemed to belong to a class of the first node and is considered "normal."

Figure 11:
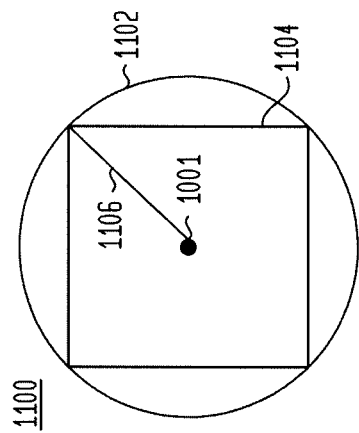
FIG. 11 is a diagram illustrating a first hyper-sphere positioned about a first hyper-cube, according to one embodiment disclosed herein.

At block 808, if a sub-segment is outside the first hyper-cube 1004, then the client device 108 determines whether the sample resides within a first hyper-sphere about the first hypercube. For example, FIG. 11 is a diagram 1100 illustrating a first hyper-sphere 1102 positioned about a first hyper-cube 1104, the first hyper-sphere 1102 having a radius equal to a diagonal 1106 of the first hyper-cube 1104. Referring back to FIG. 10, if the sub-segment 1008 resides within a first hyper-sphere 1006, then it is deemed to belong to the class of the first node 1001 and is considered normal, but with a lower confidence estimation. If the sub-segment (i.e., sub-segment 1010) is outside the first hyper-sphere 1006, then the sample is classified as unknown or suspicious.

For example, if the c[x] value is greater than the radius, then the client device 108 switches to RBF functions. Initially, the receptive field for all nodes present is set to 1. Here, a threshold adjustment scheme (i.e., using a fixed function but selecting a different threshold based on distance from the origin) is used instead of a receptive field adjustment scheme (i.e., using a function that is wider). The node is activate using a Gaussian activation equation, and the output recorded, where output for each node ranges from 1 to 0 in value. The Gaussian activation equation may be represented as:

$$x = e^{\frac{-d^2}{2r^2}}$$

where d is the diameter of the hyper-sphere and r is the radius of the hyper-sphere.

Here, the square (two-dimensional hyper-cube) has a 3 sigma side, such that a circle (two-dimensional hyper-sphere) about the square has a radius of 4.24. When input is provided and the RBF function is activated using the Gaussian activation equation, the output is a value from 1 to 0, depending on how far the sample is from the node. The threshold is the RBF output where the input is the radius of the hyper-cube, in this case 4.24 is the input to the Gaussian activation equation. Accordingly, this generates a threshold of 0.00012.

In this example, if the sub-segment included coordinates of (2,0), then the sample would be in the 3 sigma square. If the sample had coordinates of (3.5,0), then the sample would be outside the hyper-square, and the Gaussian activation equation would be used. In this example, the output would be a value greater than the threshold, and thus, the sample would be within the hyper-sphere. If, however, the sub-segment included coordinates that are less than the threshold, the sub-segment would be outside the hyper-sphere.

At block 810, client device 108 determines a likely classification for the sub-segment based on whether the sample resides within the hyper-cube or the hyper-sphere. If a hyper-cube was used for detection, the sample is deemed to belong to the first node if there is an output of 1. If RBF functions were used for detection, a node threshold is computed for the first node using an activation function, where x is the original receptive field value for the current node. If the node output is greater than or equal to the node threshold, then the sub-segment is deemed to belong to this node.

Accordingly, method 200 efficiently locates and categorizes faults in the time series data retrieved from a given sensor in a semiconductor processing chamber. In some embodiments, method 200 may further include block 210. At block 210, client device 108 attempts to classify the sub-segments in response to the sub-segments going unclassified in block 208. In one example, the mean of the signal sub-segments is used as input to the RBF network. When classifying a set of data with more than 1 input time-series signals, the signals in the identified sub-segments are may be reduced to their means. If one or more of the input signals were oscillating, this oscillation is not captured in a mean so the RBF network may not classify it correctly and may cause the normal of the sub-segment to appear "normal." In a single sensor analysis, this may be mitigated by extracting descriptive statistics.

To address this, a feed-forward, 2 layer classification neural network is used. Rather than needing training data requirements, client device 108 leverages the artificial training data (similar to block 204 above) to generate expected and fault signatures to train the neural network. Using the 2 network types, client device 108 generalizes 2 layer classification using RBF.

Figure 12:
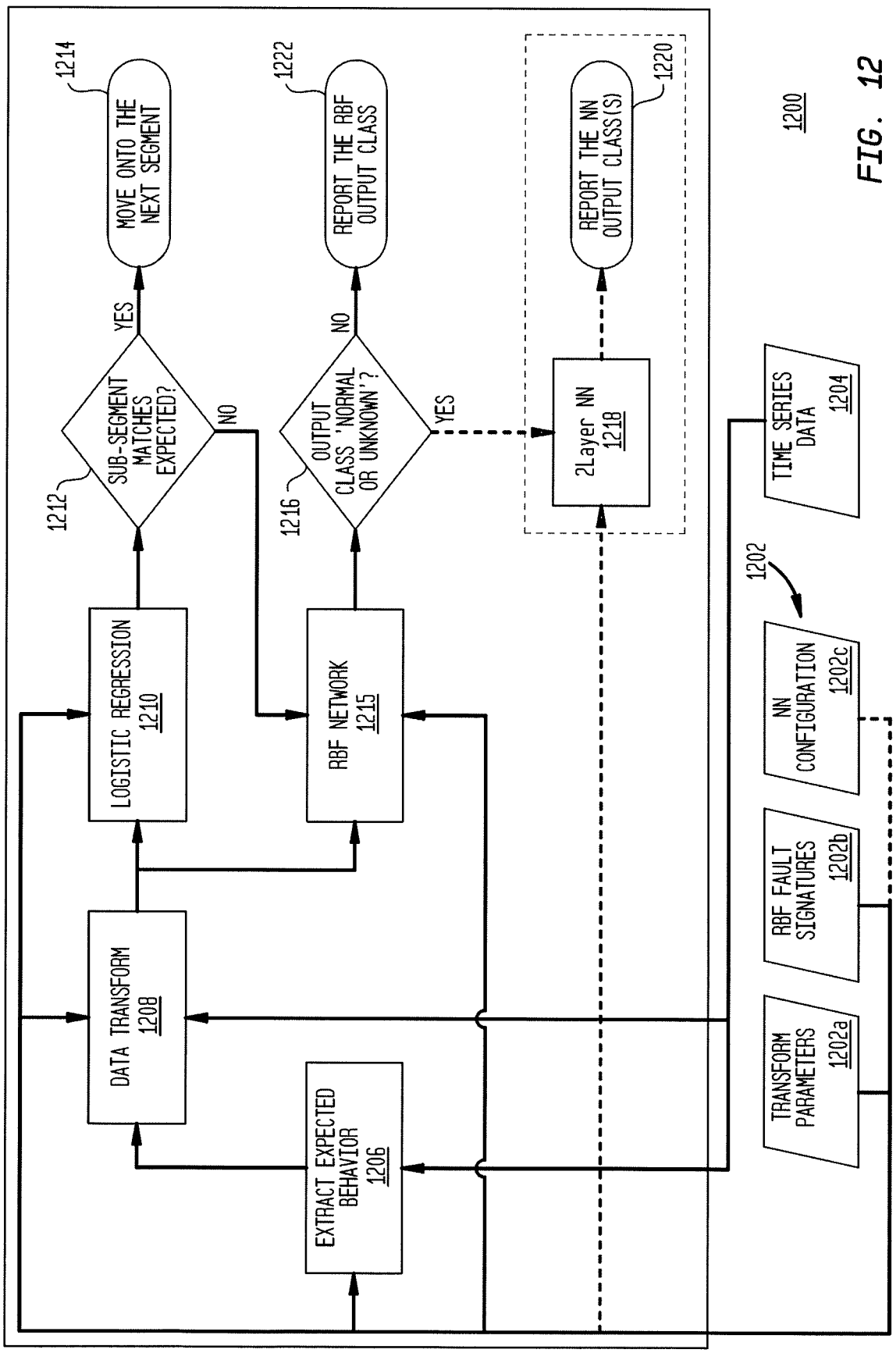
FIG. 12 is a logical flow diagram, illustrating the method discussed above in conjunction with FIG. 2, according to one embodiment disclosed herein.

FIG. 12 is a logical flow diagram 1200, illustrating the method 200 discussed above in conjunction with FIG. 2, according to one embodiment. The diagram 1200 includes one or more inputs 1202 to the client device 108. The one or more inputs 1202 may include transform parameters 1202a, RBF fault signatures 1202b, and a neural network configuration 1202c.

The transform parameters 1202a are used by client device 108 in transforming the incoming time series data. For example, the transform parameters 1202a may include the 3×n filtered matrix T'. In another embodiment, the transform parameters 1202a may further include the original time series data matrix T, as well as the critical value for the Grubbs' Rule equation used to generate filtered matrix T'. The transform parameters 1202a will contain the parameters used to prevent envelope collapse, i.e., when $r_n$ becomes small approaching zero, as discussed above. The transform parameters 1202a are used to create the T' matrix in block 1206 discussed below.

The RBF fault signatures 1202b are used by client device 108 in classifying those signal sub-segments that do not match expected behavior. For example, when client device 108 attempts to classify flagged sub-segments, client device 108 may compare the sub-segments to the inputted RBF fault signatures 1202b. Based on whether the sub-segment matches an inputted RBF fault signature 1202b, the client device 108 may be able to classify the sub-segment. Additionally, if client device 108 is unable to match the signal sub-segment to an inputted RBF fault signature 1202b, client device 108 may subsequently add the newly found signature to the RBF fault signatures 1202b in a subsequent analysis.

The neural network configuration 1202c is used by client device 108 in identifying those signal sub-segments that may have been unclassified by client device 108 in the fault signature detection. For example, the neural network configuration 1202c may be used in generating the 2-layer neural network used to address the blind-spot discussed above when identifying multiple co-varying signals. The neural network configuration 1202c is thus used to generalize the RBF for specific fault traces.

The time series data 1204 is transmitted to the client device 108. The time series data 1204 undergoes an expected behavior extraction 1206. For example, as discussed above in conjunction with FIG. 2, expected behavior is created from the time-series data 1204 using Grubbs rule and the transform parameters 1202a to prevent 'envelope collapse', resulting in the T' matrix. The flow diagram 1200 then proceeds to data transform block 1208 where the incoming time series data 1204 is transformed via the T' matrix.

The transformed data proceeds to the logistic regression block 1210. As discussed above in conjunction with block 206 of FIG. 2, in the logistic regression block 1210, client device 108 generates a logistic regression fit of the filtered time series data to identify one or more outlier sub-segments. At the block 1212, client device 108 determines whether the sub-segments match the expected behavior determined at block 1206.

If at block 1212, the client device determines that a sub-segment matches the expected behavior, then at block 1214, the client device 108 moves on to another sub-segment. If, however, at block 1212, the client device 108 determines that the sub-segment does not match the expected behavior, then at block 1215, the flow diagram progresses to the RBF network block to classify the sub-segment.

At block 1216, the client device 108 determines the classification of the sub-segment as "normal" or "unknown." For example, if the sub-segment matches an existing RBF fault signature 1202b, the client device 108 reports the sub-segment as normal. In this case, the client device 108 may optionally pass the sub-segment to the 2 layer neural network (block 1218). For example, the neural network configuration 1202c is used to identify sub-segments that the previous classifier (block 1216) may have missed (or been blind to). At block 1220, the client device reports the neural network output class. If, however, the sub-segment does not match an existing RBF signature 1202b, then client device 108 reports the sub-segment as unknown (block 1222).

Figure 13:
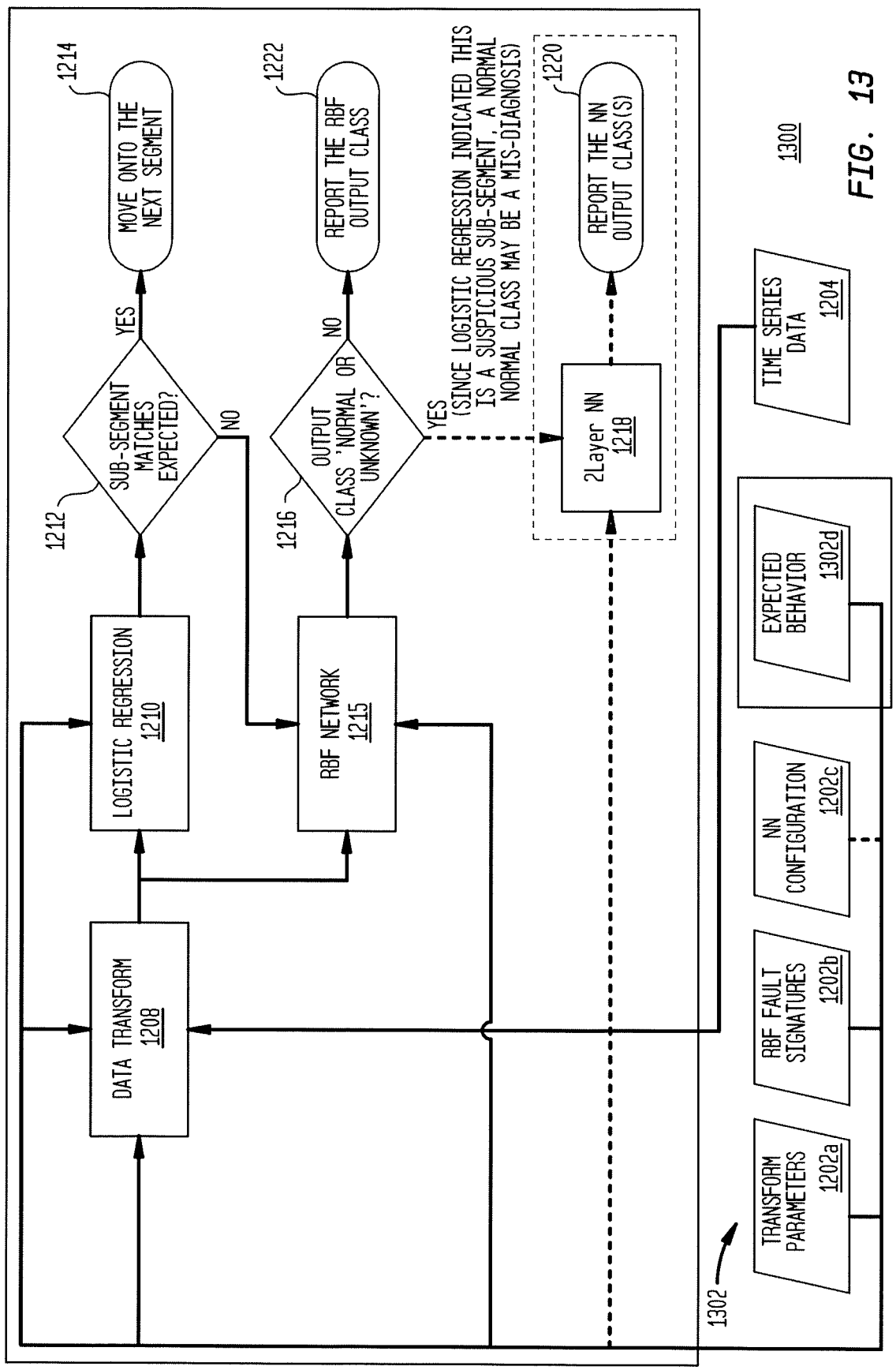
FIG. 13 is a logical flow diagram 1300, illustrating the method 200 discussed above in conjunction with FIG. 2, according to one embodiment.

FIG. 13 is a logical flow diagram 1300, illustrating the method 200 discussed above in conjunction with FIG. 2, according to one embodiment. Diagram 1300 is substantially similar to diagram 1200. However, in diagram 1300, the expected behavior 1302d is used as an additional input 1302 along with transform parameters 1202a, RBF fault signatures 1202b, and neural network configuration 1202c. As such, block 1206 in FIG. 12 is omitted in FIG. 13.

Figure 14:
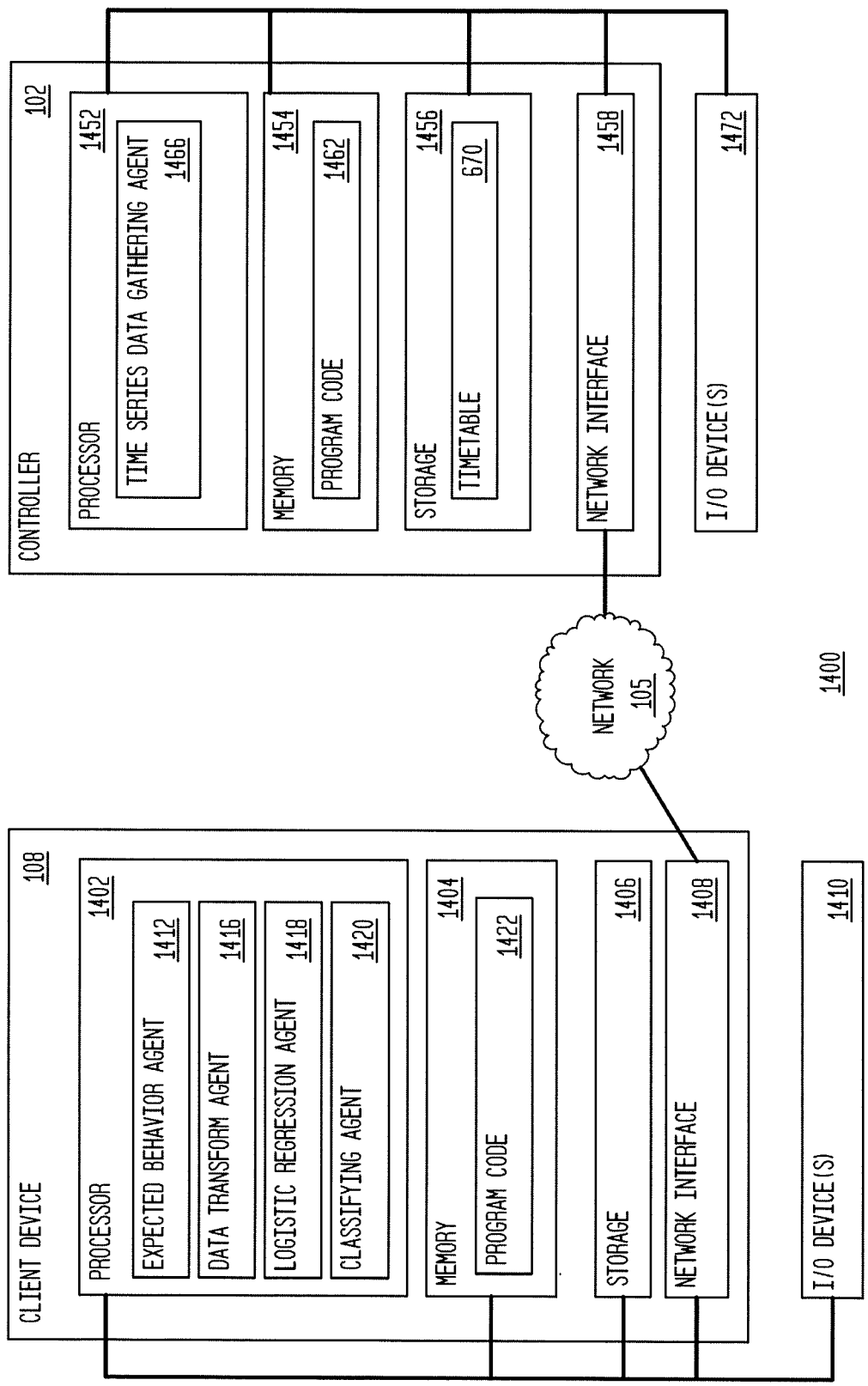
FIG. 14 illustrates computing platform 1400, according to one embodiment disclosed herein.

FIG. 14 illustrates computing platform 1400, according to one embodiment. Computing platform 1400 includes client device 108 and controller 102. As shown, client device 108 includes a processor 1402, memory 1404, storage 1406, and network interface 1408. In some embodiments, the client device 108 may further include one or more I/O devices 1410 coupled thereto. The processor 1402 is included to be representative of a single processor, multiple processors, a single processor having multiple processing cores, and the like.

The processor 1402 may include an expected behavior agent 1412, a data transform agent 1416, and logistic regression agent 1418, and a classifying agent 1420. The expected behavior agent 1412 is configured to generate an expected behavior of the time series data. For example, the expected behavior agent 1412 generates the training data discussed above in conjunction with FIG. 2. The data transform agent 1416 is configured to transform the incoming time series data into an envelope as defined by the transform matrix T'. The logistic regression agent 1418 is configured to identify those segments of the transformed time series data that do not match an expected behavior. For example, logistic regression agent 148 is configured to identify those segments by determining if they are exterior to the envelope defined by the transform matrix T'. The classifying agent 1420 is configured to classify those sub-segments that do not match an expected behavior based on RBF fault signatures. For example, the classifying agent 1420 uses an RBF neural network configuration to classify the sub-segments.

The memory 1404 includes program code 1422. The program code 1422 is configured to carry out the instructions of classifying one or more outliers contained in time series data collected from sensors in a semiconductor processing chamber. For example, the program code 1422 may include the methods discussed above in conjunction with FIGS. 2-13.

The storage 1406 may be a disk drive storage. Although shown as a single unit, the storage 1406 may be a combination of fixed and/or removable storage devices, such as fixed disk drives, removable memory cards, optical storage, network attached storage (NAS), or storage-area-network (SAN). The network interface 1408 may be any type of network communications allowing the controller to communicate with other computers via the network 105, such as, for example, controller 102.

Controller 102 includes a processor 1452, a memory 1454, storage 1456, and network interface 1458. The processor 1452 retrieves and executes programming instructions, such as program code 1462, stored in memory 1454. The processor 1452 is included to be representative of a single processor, multiple processors, a single processor having multiple processing cores, and the like. As shown, the processor 1452 includes a time series data gathering agent 1466. The time series data gathering agent 1466 is configured to receive sensor data from each of the one or more sensors 106. In some embodiments, time series data gathering agent 1466 is configured to generate a data set for each sensor 106. For example, time series data gathering agent 1466 generates a first data set for the first sensor and a second data set for the second sensor.

The storage 1456 may be a disk drive storage. Although shown as a single unit, the storage 1456 may be a combination of fixed and/or removable storage devices, such as fixed disk drives, removable memory cards, optical storage, network attached storage (NAS), or storage-area-network (SAN). The network interface 1458 may be any type of network communications allowing the controller 102 to communicate with other computers via network 105, such as, for example, client device 108.

While the foregoing is directed to embodiments of the present invention, other and further embodiments of the invention may be devised without departing from the basic scope thereof, and the scope thereof is determined by the claims that follow.

What is claimed is:

1. A method of classifying an outlier in time series data collected by a sensor positioned in a substrate processing chamber, comprising:
   receiving time series data from the sensor monitoring a metric related to the processing of a substrate and positioned to collect substrate processing data in the substrate processing chamber;
   converting the time series data to a bounded uniform signal, wherein the bounded uniform signal is a refined range of the time series data which removes false positives in the time series data;
   identifying signal sub-segments of the bounded uniform signal that do not match an expected behavior, wherein the identified signal sub segments are anomalies in the refined range of the time series data;
   classifying the identified signal sub-segments that do not match the expected behavior to identify new fault signatures; and
   determining a decision boundary for a health of the substrate processing chamber for suitability of processing additional substrates in response to a classification of the identified signal sub-segments, and halting processing of substrates when the health of the substrate processing chamber is outside the decision boundary.

2. The method of claim 1, further comprising:
   identifying signal sub-segments of the bounded uniform signal which are unclassified; and
   classifying the unclassified signal sub-segments with a neural network.

3. The method of claim 1, wherein converting the time series data to the bounded uniform signal comprises:
   removing all outliers from the time series data received from the sensor;
   generating a matrix of time series data without the outliers; and
   transform the received time series data using the matrix of time series data without the outliers into the bounded uniform signal.

4. The method of claim 1, wherein identifying signal sub-segments that do not match the expected behavior, comprises:

generating training set data within an envelope defining the bounded uniform signal;

partitioning the time series data into a plurality of sub-segments; and calculating a distance between a normal of the sub-segment and a normal of the envelope.

5. The method of claim 1, wherein classifying the identified signal sub-segments that do not match an expected behavior, comprises:

generating a node directed to a first sample class;

generating a hypercube about the node; and generating a hypersphere circumscribing the hypercube.

6. The method of claim 5, further comprising:

determining whether the sub-segment resides in the hypercube; and responsive to determining that the sub-segment resides in the hypercube, classifying the sub-segment in the first sample class.

7. The method of claim 5, further comprising:

determining whether the sub-segment resides in the hypercube;

responsive to determining that the sub-segment does not reside in the hypercube, determining whether the sub-segment resides in the hypersphere;

responsive to determining that the sub-segment resides in the hypersphere, classifying the sub-segment in the first sample class; and responsive to determining that the sub-segment resides outside the hypersphere, matching the signal sub-segment to an inputted Radial Basis Function fault signature.

8. A system, comprising:

a processor; and a memory having instructions stored thereon, which, when executed by the processor, performs an operation for classifying an outlier in time series data collected by a sensor positioned in a substrate processing chamber, the operation comprising:

receiving time series data from the sensor monitoring a metric related to the processing of a substrate and positioned to collect substrate processing data in the substrate processing chamber;

converting the time series data to a bounded uniform signal, wherein the bounded uniform signal is a refined range of the time series data which removes false positives in the time series data;

identifying signal sub-segments of the bounded uniform signal that do not match an expected behavior, wherein the identified signal sub segments are anomalies in the refined range of the time series data;

classifying the identified signal sub-segments that do not match the expected behavior to identify new fault signatures; and determining a decision boundary for a health of the substrate processing chamber for suitability of processing additional substrates in response to a classification of the identified signal sub-segments, and halting processing of substrates when the health of the substrate processing chamber is outside the decision boundary.

9. The system of claim 8, further comprising:

identifying signal sub-segments of the bounded uniform signal which are unclassified; and classifying the unclassified signal sub-segments with a neural network.

10. The system of claim 8, wherein converting the time series data to the bounded uniform signal comprises:

removing all outliers from the time series data received from the sensor;

generating a matrix of time series data without the outliers; and transform the received time series data using the matrix of time series data without the outliers into the bounded uniform signal.

11. The system of claim 8, wherein identifying signal sub-segments that do not match the expected behavior, comprises:

generating training set data within an envelope defining the bounded uniform signal;

partitioning the time series data into a plurality of sub-segments; and calculating a distance between a normal of the sub-segment and a normal of the envelope.

12. The system of claim 8, wherein classifying the identified signal sub-segments that do not match an expected behavior, comprises:

generating a node directed to a first sample class;

generating a hypercube about the node; and generating a hypersphere circumscribing the hypercube.

13. The system of claim 12, further comprising:

determining whether the sub-segment resides in the hypercube; and responsive to determining that the sub-segment resides in the hypercube, classifying the sub-segment in the first sample class.

14. The system of claim 12, further comprising:

determining whether the sub-segment resides in the hypercube;

responsive to determining that the sub-segment does not reside in the hypercube, determining whether the sub-segment resides in the hypersphere;

responsive to determining that the sub-segment resides in the hypersphere, classifying the sub-segment in the first sample class; and responsive to determining that the sub-segment resides outside the hypersphere, matching the signal sub-segment to an inputted Radial Basis Function fault signature.

15. A non-transitory computer readable medium having instructions stored thereon, which, when executed by a processor, cause the processor to perform a method of classifying an outlier in time series data collected by a sensor positioned in a substrate processing chamber, comprising:

receiving time series data from the sensor monitoring a metric related to the processing of a substrate and positioned to collect substrate processing data in the substrate processing chamber;

converting the time series data to a bounded uniform signal, wherein the bounded uniform signal is a refined range of the time series data which removes false positives in the time series data;

identifying signal sub-segments of the bounded uniform signal that do not match an expected behavior, wherein the identified signal sub segments are anomalies in the refined range of the time series data;

classifying the identified signal sub-segments that do not match the expected behavior to identify new fault signatures; and determining a decision boundary for a health of the substrate processing chamber for suitability of processing additional substrates in response to a classification of the identified signal sub-segments, and halting processing of substrates when the health of the substrate processing chamber is outside the decision boundary.

16. The non-transitory computer readable medium of claim 15, further comprising:
  identifying signal sub-segments of the bounded uniform signal which are unclassified; and
  classifying the unclassified signal sub-segments with a neural network.

17. The non-transitory computer readable medium of claim 15, wherein converting the time series data to the bounded uniform signal comprises:
  removing all outliers from the time series data received from the sensor;
  generating a matrix of time series data without the outliers; and
  transform the received time series data using the matrix of time series data without the outliers into the bounded uniform signal.

18. The non-transitory computer readable medium of claim 15, wherein identifying signal sub-segments that do not match the expected behavior, comprises:
  generating training set data within an envelope defining the bounded uniform signal;
  partitioning the time series data into a plurality of sub-segments; and
  calculating a distance between a normal of the sub-segment and a normal of the envelope.

19. The non-transitory computer readable medium of claim 15, wherein classifying the identified signal sub-segments that do not match an expected behavior, comprises:
  generating a node directed to a first sample class;
  generating a hypercube about the node; and
  generating a hypersphere circumscribing the hypercube.

20. The non-transitory computer readable medium of claim 19, further comprising:
  determining whether the sub-segment resides in the hypercube;
  responsive to determining that the sub-segment resides in the hypercube, classifying the sub-segment in the first sample class;
  responsive to determining that the sub-segment does not reside in the hypercube, determining whether the sub-segment resides in the hypersphere;
  responsive to determining that the sub-segment resides in the hypersphere, classifying the sub-segment in the first sample class; and
  responsive to determining that the sub-segment resides outside the hypersphere, matching the signal sub-segment to an inputted Radial Basis Function fault signature.

* * * * *